United States Patent [19]
Nakagawa

[11] Patent Number: 4,952,158
[45] Date of Patent: Aug. 28, 1990

[54] CONDUCTIVE BOARD SPACER

[75] Inventor: Asaharu Nakagawa, Yokkaichi, Japan

[73] Assignee: Kitagawa Industries Co., Ltd., Aichi, Japan

[21] Appl. No.: 438,007

[22] Filed: Nov. 20, 1989

[30] Foreign Application Priority Data

Dec. 12, 1988 [JP] Japan .................. 63-314462

[51] Int. Cl.$^5$ .............................. H01R 4/66
[52] U.S. Cl. ...................... 439/96; 439/65; 174/138 G
[58] Field of Search .............. 439/96, 65, 74, 75, 439/78, 81, 82, 84; 174/138 G; 361/412, 413

[56] References Cited

U.S. PATENT DOCUMENTS

| | | | |
|---|---|---|---|
| 4,495,380 | 1/1985 | Ryan et al. | 361/412 X |
| 4,635,326 | 1/1987 | Yagi | 361/412 X |
| 4,646,383 | 3/1987 | Sugiyura | 439/74 X |

FOREIGN PATENT DOCUMENTS

| | | |
|---|---|---|
| 58-35386 | 8/1983 | Japan . |
| 60-8462 | 3/1985 | Japan . |
| 59-927651 | 8/1989 | Japan . |
| 938327 | 10/1963 | United Kingdom ........ 361/412 |

Primary Examiner—Eugene F. Desmond
Attorney, Agent, or Firm—Oliff & Berridge

[57] ABSTRACT

The conductive spacer of this invention comprises a supporting member and locking members extending from both ends of the supporting member. When the locking members pass through holes in printed boards, the conductive spacer secures the printed boards a certain distance. The conductive spacer is molded as one piece from synthetic resin mixed with whisker-shaped carbon fiber with a small diameter as a conductive filler. The conductive spacer is thus durable. Additionally, the carbon fiber reinforces thin portions in the conductive spacer. This durable, conductive spacer can equalize ground potential of the printed boards.

5 Claims, 2 Drawing Sheets

CONDUCTIVE BOARD SPACER

BACKGROUND OF THE INVENTION

This invention relates to a conductive board spacer for fixing two opposing printed boards at a predetermined space while enhancing the function of the printed boards.

Conventionally, this conductive board spacer is composed of synthetic resins or metals.

Japanese Published Examined Patent Application No. 58-35386 and Japanese Published Examined Utility Model Application Nos. 59-27651 and 60-8462 disclose board spacers of synthetic resin having a predetermined length. The synthetic-resin spacers have a supporting member with both ends of the supporting member contacting printed boards. Locking members extend from the ends of the supporting member for engaging fixing holes in the printed boards. The locking members, which are arrowhead-shaped, pass through the holes, resiliently expand outward, return to their original configuration and become secured in the fixing holes. The synthetic-resin spacers thus secure the printed boards, and easily engage and disengage from the boards.

On the other hand, metallic spacers have a long, hexagonal bolt. The bolt engages screwed holes in the printed boards, and nuts screw onto the bolt, thus fixing the spacer to the printed boards. The spacers keep the printed boards a certain distance apart and equalize the ground potential between the printed boards. Signal conductors laid between the printed boards are thus effectively used.

However, the synthetic-resin spacers do not equalize the ground potential between the printed boards. On the other hand, since the metallic spacers must be fixed to or disengaged from the printed boards using the nuts, the application of the spacers is troublesome and time-consuming.

Conductive spacers, which have been developed to provide advantages of the abovementioned spacers, are molded as one piece from synthetic resin with conductive fillers such as metallic particles, having a particle size of several tens of microns, or carbon black.

However, the conductive spacers develop problems. The conductive filler provides conductivity to the conductive spacers. When the conductive filler is mixed into synthetic resin, the electric resistivity of the synthetic resin is reduced, but its mechanical strength is also reduced. The amount of conductive filler must be carefully regulated.

The optimum resistivity for grounding the printed boards each other is $5 \times 10^{-5}$ ohm.cm or less. As the amount of the conductive filler is increased to provide optimum conductivity, the synthetic resin becomes brittle. Especially, the excess amount of the conductive filler deteriorates the strength and durability of thin portions of the conductive spacer which portions engage the fixing holes in the printed boards.

SUMMARY OF THE INVENTION

The object of this invention is to provide a durable, conductive spacer that easily engages and disengages from the printed boards, and equalizes ground potential of the printed boards.

In order to achieve this object, a conductive board spacer comprises a supporting member for supporting upper and lower boards a certain distance apart, and upper and lower locking members extending from both ends of the supporting member for detachably engaging holes in the upper and lower boards. The conductive board spacer is molded as one piece from synthetic resin with carbon fiber mixed therein. The carbon fiber is generated through a gaseous phase method in which hydrocarbon is thermally decomposed and is developed from high-melting metal and/or ultrafine particles of the compound of the high-melting metal.

As aforementioned, the conductive spacer is molded as one piece from the compound material of synthetic resin reinforced by carbon fiber mixed as a conductive filler. The known synthetic resin can be used such as nylon, ABS resin, polypropylene, polyvinyl resin, polyester resin, vinyl resin, polyamide resin or others.

Different from polyacrylonitrile carbon fiber and pitch carbon fiber, the carbon fiber mixed in the synthetic resin in this invention is whisker-shaped and has a diameter close to that of the ultrafine particles of the high-melting metal and/or its compound. The diameter of the carbon fiber is smaller than that of the metallic conductive particles mixed in the base material of the related-art spacers. The carbon fiber is compatible with the base material of synthetic resin and is superior in its orientation in the direction of injection of the synthetic resin. The carbon fiber can thus be dispersed and retained uniformly in the synthetic resin. In addition, the carbon fiber includes neatly crystallized graphite layers, and has excellent tensile strength as well as conductivity. The carbon fiber uniformly dispersed in the synthetic resin gives high conductivity and excellent mechanical properties to the conductive spacer.

The high-melting metal, which is the developing point of the carbon fiber, does not gasify at 950° C. to 1300° C., the temperature range in which hydrocarbon is thermally decomposed. For the high-melting metal, available is titanium (Ti), zirconium (Zr) or the like in group IVa according to the periodic system, vanadium (V), niobium (Nb) or tantalum (Ta) in group Va, chromium (Cr), molybdenum (Mo) or the like in group VIa, manganese (Mn) or the like in group VIIa, or iron (Fe), cobalt (Co), nickel (Ni) or the like in group VIII. Metals Fe, Co, Ni, V, Nb, Ta, Ti, and Zr are best. The oxide, nitride, chloride or the like of the metals is used as the high-melting metal compound.

The amount of the carbon fiber mixed in the synthetic resin determines the conductivity of the conductive board spacer composed of the synthetic resin. When the synthetic resin contains from 20% to 50% by volume of the carbon fiber, its electrical resistivity can be lower than $5 \times 10^{-1}$ ohm.cm.

When the conductive spacer is inserted in the fixing holes in the boards, the supporting member contacts both the boards. The conductive spacer keeps the boards a certain distance apart, makes a circuit between the boards, and equalizes the ground potential of the boards.

DETAILED DESCRIPTION OF THE PREFERRED EMBODIMENTS

Figure 1:
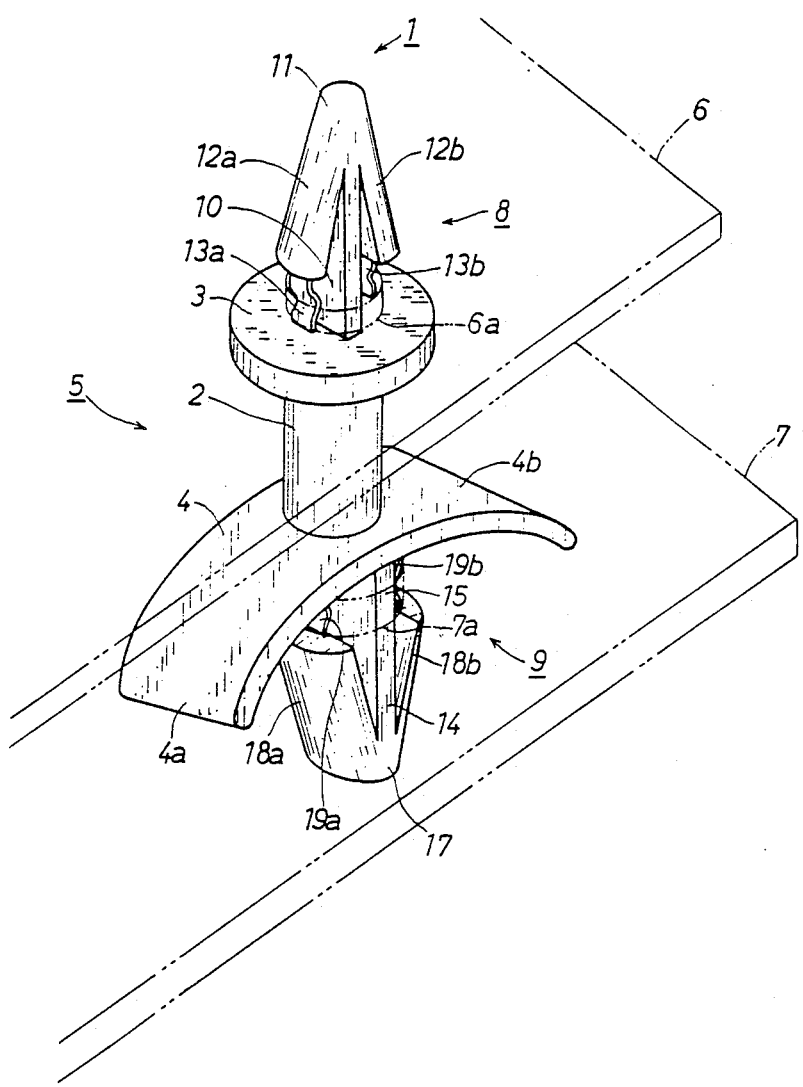
FIG. 1 is a perspective view of a first embodiment of the present invention.

The first embodiment is explained referring to FIG. 1. A conductive spacer 1 for the first embodiment is molded as a single piece from nylon 6 resin with 30% by volume of carbon fiber mixed. The carbon fiber is from 0.1 mm to 1 mm long with a diameter of 0.1 microns to 0.5 microns. The carbon fiber is developed from iron particles with a particle size of 0.02 microns to 0.03 microns through a gaseous phase method at 950° C. to 1300° C. in which temperature range benzene is thermally decomposed. The carbon fiber has a tensile strength of 14.0 kg/mm$^2$ and an electrical resistivity of $8 \times 10^{2}$ ohm.cm.

As shown in FIG. 1, the conductive spacer 1 is a combination of a supporting body 5, a spindle 8, and an anchor 9. The supporting body 5 comprises a center column 2 and upper and lower bases 3 and 4 formed on respective ends of the center column 2. The upper base 3 is formed as a sword guard and the lower base 4 is a strip curved outward. The spindle 8 and the anchor 9 extend from the center of the upper and lower bases 3 and 4 and engage holes 6a and 7a in printed boards 6 and 7, respectively.

In the spindle 8, a uniformly thick shaft 10 extends from the center of the upper base 3 along the same axis as the column 2 and connects with arrowhead arms 12a and 12b. The arrowhead arms 12a and 12b spread as the slope from a point 11 downward toward the upper base 3, and connect through strips 13a and 13b to the upper base 3.

Like the spindle 8, the anchor 9 comprises a uniformly thick shaft 14 extending from the center of the underside of the lower base 4 along the same axis as the column 2. Resilient braces 4a and 4b extend laterally from a root 15 of the shaft 14, and form a circular arc to press against the surface of the printed board 7 when the conductive spacer 1 is attached to the printed board 7. Detent legs 18a and 18b slope upward from a point 17 of the shaft& 14, and connect through strips 19a and 19b to the lower base 4.

When the conductive spacer 1 is used, as shown in FIG. 1, the anchor 9 of the conductive spacer 1 is placed upright in the hole 7a in the printed board 7. When the detent legs 18a and 18b first pass through the hole 7a and then expand outward using their resiliency, the detent legs 18a and 18b press the outer surface of the printed board 7, and the braces 4a and 4b press the inner surface of the printed board 7 using their restoring force. The conductive spacer 1 is thus held immobile on the printed board 7 by the braces 4a, 4b and the detent legs 18a, 18b.

Subsequently, the hole 6a in another printed board 6 is placed over the spindle 8 of the conductive spacer 1 set upright in the printed board 7, and the spindle 8 engages the printed board 6 through the hole 6a. The printed board 6 is thus supported firmly between the arrowhead arms 12a, 12b and the upper base 3.

When the conductive spacer 1 is thus secure between the printed boards 6 and 7, the braces 4a and 4b of the lower base 4 press against the printed board 7. On the other end, the upper surface of the upper base 3 firmly contacts the printed board 6.

By inserting the spindle 8 and the anchor 9, respectively, in the holes 6a and 7a in the printed boards 6 and 7, the conductive spacer 1 maintains a certain distance between the printed boards 6 and 7. Concurrently, the conductive spacer 1, which has an electrical resistivity of $8 \times 10^{-2}$ ohm.cm or lower, forms an electric circuit between the printed boards 6 and 7 for grounding. The conductive spacer 1 can be easily attached to and detached from the printed boards 6 and 7 as in the prior-art synthetic resin spacers, thus increasing the operation efficiency. Conductive wires of a flat cable (not shown) connected between the printed boards 6 and 7 can be used for transmitting control signals between the printed boards 6 and 7.

The conductive spacer 1 for the first embodiment, which is molded from nylon 6 resin reinforced by the carbon fiber, is light-weight and has excellent mechanical properties. When the prior-art synthetic resin spacers are engaged in and disengaged from the holes in the printed boards from 3,000 to 5,000 times, the thin connecting strips of the spacers break. On the other hand, the conductive spacer 1 for the first embodiment can be attached to or detached from the printed boards 8,000 or more times due to its durability. The center column 2 of the conductive spacer 1 has a diameter about three-fourth the diameter of the center column of the prior-art synthetic resin spacers. The thickness of the lower base 4 is also about three-fourth that of the lower base of the prior-art synthetic resin spacers. The conductive spacer 1 is thus light-weight, while maintaining high mechanical strength.

The carbon fiber mixed in the nylon 6 resin enhances the restoring force of the resilient braces 4a and 4b of the lower base 4. The resilient braces 4a and 4b firmly secure the printed board 7.

Figure 2:
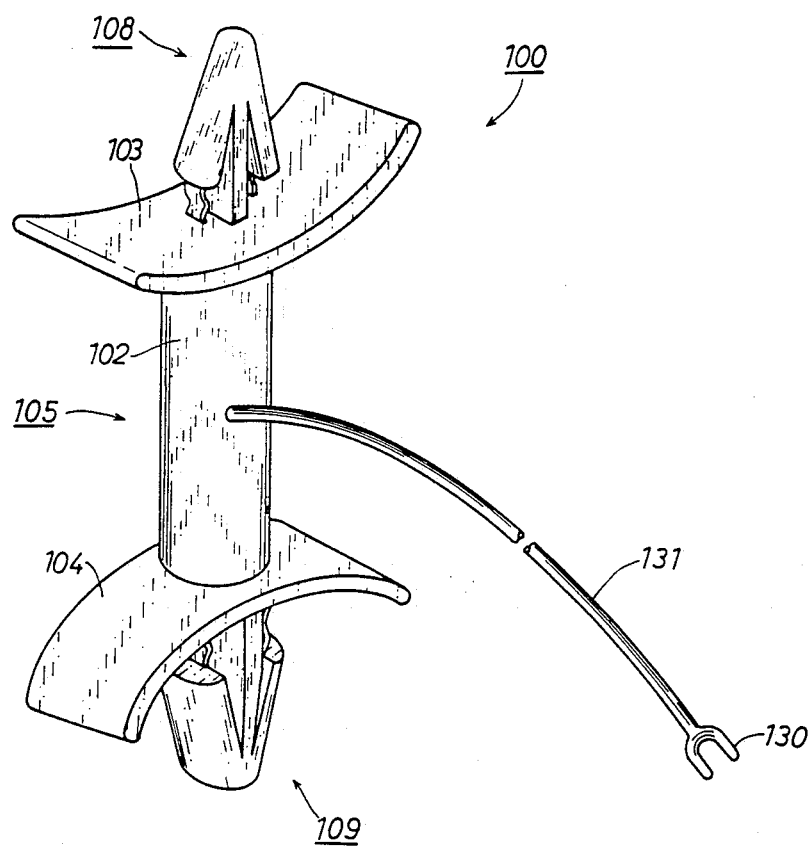
FIG. 2 is a perspective view of a second embodiment of the present invention.

A conductive spacer 100 for a second embodiment is explained referring to FIG. 2. The conductive spacer 100 is molded as one piece from nylon 66 resin with 35% by volume of the same carbon fiber as that mixed in the first embodiment. 127 The conductive spacer 100 has a tensile strength of 13.6 kg/mm$^2$ and an electrical resistivity of $3 \times 10^{-2}$ ohm.cm.

The conductive spacer 100 comprises a supporting body 105, a spindle 108, an anchor 109, and a grounding conductor 131. A supporting body 105 comprises a center column 102 having braces 103 and 104 on its both ends. The spindle 108 and the anchor 109 extend from &he braces 103 and 104, respectively. The grounding conductor 131 extends from the center column 102 to a U-shaped engaging portion 130.

When the conductive spacer 100 is used in the same way as the first embodiment, the spindle 108 and the anchor 109 can pass through holes in printed boards not shown.

After passing through the holes in the printed boards, the spindle 108 and the anchor 109 restore their original configurations and press the outer surfaces of the printed boards. On the other hand, the edges of &he braces 103 and 104 resiliently deform and firmly contact the inner surfaces of the printed boards. In the same way as the first embodiment, the conductive spacer 100 thus secures the printed boards.

The engaging portion 130 of the grounding conductor 131 can be attached to terminals on a chassis.

By inserting the spindle 108 and the anchor 109, respectively, in the holes and in the printed boards, the conductive spacer 100 maintains a certain distance between the printed boards. Concurrently, the conductive spacer 100, which has an electrical resistivity of $3 \times 10^{-2}$ ohm.cm, makes an electric circuit among the printed boards and the chassis. The electric circuit can ground the printed boards and the chassis with one another.

In the same way as the first embodiment, the conductive spacer 100 can be easily attached to and detached from the printed boards, thus increasing the operation efficiency. Conductive wires of a flat cable (not shown)

connected between the printed boards can be used for transmitting control signals between the printed boards. Since the conductive spacer 100 is composed of nylon 66 resin reinforced by the carbon fiber, it is light-weight and durable.

The braces 103 and 104 provided on respective ends of the center column 102 secure the printed boards. When the printed boards are grounded, the grounding conductor 131 extending from the center column 102 can ground the chassis, preventing the conductive spacer 100 from heating excessively.

Although specific embodiments of the invention have been described for the purpose of illustration, the invention is not limited to these embodiments. This invention includes all embodiments and modifications that come within the scope of the claims. For example, the points of the upper and lower locking members can be arch-shaped.

What is claimed is:

1. A conductive board spacer comprising:
    a supporting member for supporting upper and lower boards a certain distance apart; and
    upper and lower locking members extending from both ends of the supporting member for detachably engaging holes in the upper and lower boards:
    the conductive board spacer being molded as one piece from synthetic resin with carbon fiber mixed therein.

2. The conductive board spacer of claim 1, wherein the carbon fibers are from 0.1 mm to 1.0 mm long and have a diameter of 0.1 to 0.5 microns.

3. The conductive board spacer of claim 1, wherein the carbon fibers form a lattice-like structure in the synthetic resin to provide conductivity to the synthetic resin.

4. The conductive board spacer of claim 1 further comprising a grounding means for connecting the board spacer to a reference potential point.

5. The conductive board spacer of claim 4, wherein the grounding means comprises a flexible electrical conductor having two ends, with one end attached to the board spacer and the other end attached to an engaging means for engaging the reference potential point.

* * * * *